(12) United States Patent
Finney et al.

(10) Patent No.: US 9,007,731 B2
(45) Date of Patent: Apr. 14, 2015

(54) LEVERAGING INHERENT REDUNDANCY IN A MULTIFUNCTION IED

(75) Inventors: Dale S. Finney, Sydney Mines (CA); Bogdan Z. Kasztenny, Markham (CA); Normann Fischer, Colfax, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 464 days.

(21) Appl. No.: 13/430,391

(22) Filed: Mar. 26, 2012

(65) Prior Publication Data
US 2013/0250458 A1 Sep. 26, 2013

(51) Int. Cl.
| H02H 9/00 | (2006.01) |
| H02H 3/26 | (2006.01) |
| G01R 31/00 | (2006.01) |
| H02H 3/05 | (2006.01) |
| H02H 3/00 | (2006.01) |
| H02H 7/00 | (2006.01) |
| G01R 19/25 | (2006.01) |

(52) U.S. Cl.
CPC . *H02H 3/05* (2013.01); *H02H 3/26* (2013.01); *G01R 19/2513* (2013.01)

(58) Field of Classification Search
CPC .............. H02H 3/26; H02H 9/00; H02H 3/05
USPC ............................................... 361/42, 62, 65
See application file for complete search history.

(56) References Cited

U.S. PATENT DOCUMENTS

| 3,946,281 A | 3/1976 | Llona |
| 4,296,475 A | 10/1981 | Nederlof |
| 4,493,081 A | 1/1985 | Schmidt |
| 4,506,362 A | 3/1985 | Morley |
| 4,521,872 A | 6/1985 | Sawada |

(Continued)

FOREIGN PATENT DOCUMENTS

| JP | 59176939 | 10/1984 |
| JP | 59196698 | 11/1984 |

(Continued)

OTHER PUBLICATIONS

PCT/US2012/068966 Patent Cooperation Treaty, International Search Report and Written Opinion of the International Searching Authority, Feb. 20, 2013.

(Continued)

*Primary Examiner* — Thienvu Tran
*Assistant Examiner* — Lucy Thomas
(74) *Attorney, Agent, or Firm* — Stoel Rives LLP; Richard M. Edge

(57) ABSTRACT

Disclosed herein are systems and methods for leveraging the inherent redundancy of electrical measurement inputs available to microprocessor-based intelligent electronic devices (IEDs). Specifically, an IED may receive a plurality of electrical measurements associated with an electric power delivery system, such as measurements associated with a generator. A first protection module may be configured to detect a first type of electrical disturbance using a first subset of the plurality of electrical measurements. A second protection module may be configured to detect a second type of electrical disturbance using a second subset of the plurality of electrical measurements. A first redundant protection module may be configured to verify the detection of the first type of electrical disturbance using at least a portion of the second subset of the plurality of electrical measurements.

36 Claims, 16 Drawing Sheets

(56) References Cited

U.S. PATENT DOCUMENTS

| | | |
|---|---|---|
| 4,530,431 A | 7/1985 | Spurlin |
| 4,534,031 A | 8/1985 | Jewer |
| 4,672,501 A | 6/1987 | Bilac |
| 4,769,735 A | 9/1988 | Ueda |
| 4,812,995 A | 3/1989 | Girgis |
| 5,083,036 A | 1/1992 | Beers |
| 5,276,690 A | 1/1994 | Lee |
| 5,497,322 A | 3/1996 | Kolomyski |
| 5,533,195 A | 7/1996 | LaRochelle |
| 5,555,250 A | 9/1996 | Walker |
| 5,602,709 A | 2/1997 | Al-Dabbagh |
| 5,627,716 A | 5/1997 | Lagree |
| 5,742,513 A | 4/1998 | Bouhenguel |
| 5,754,053 A | 5/1998 | Bourdeau |
| 5,844,918 A | 12/1998 | Kato |
| 5,847,913 A | 12/1998 | Turner |
| 5,856,903 A | 1/1999 | Smith |
| 5,872,722 A | 2/1999 | Oravetz |
| 5,917,841 A | 6/1999 | Kodama |
| 5,987,393 A | 11/1999 | Stinson |
| 6,055,145 A | 4/2000 | Lagree |
| 6,138,253 A | 10/2000 | Buzsaki |
| 6,195,241 B1 | 2/2001 | Brooks |
| 6,195,767 B1 | 2/2001 | Adams |
| 6,201,997 B1 | 3/2001 | Giers |
| 6,292,911 B1 | 9/2001 | Swanson |
| 6,397,355 B1 | 5/2002 | Curtis |
| 6,414,829 B1 | 7/2002 | Haun |
| 6,453,440 B1 | 9/2002 | Cypher |
| 6,457,146 B1 | 9/2002 | Keen |
| 6,473,880 B1 | 10/2002 | Cypher |
| 6,477,682 B2 | 11/2002 | Cypher |
| 6,594,774 B1 | 7/2003 | Chapman |
| 6,615,376 B1 | 9/2003 | Olin |
| 6,839,868 B1 | 1/2005 | Pignol |
| 6,874,107 B2 | 3/2005 | Lesea |
| 6,886,116 B1 | 4/2005 | MacLellan |
| 6,970,037 B2 | 11/2005 | Sakhuja |
| 6,973,613 B2 | 12/2005 | Cypher |
| 6,983,414 B1 | 1/2006 | Duschatko |
| 7,355,301 B2 | 4/2008 | Ockert |
| 7,621,671 B2 | 11/2009 | Petruzzi |
| 7,630,863 B2 | 12/2009 | Zweigle |
| 2003/0033575 A1 | 2/2003 | Richardson |
| 2003/0097628 A1 | 5/2003 | Ngo |
| 2003/0101008 A1 | 5/2003 | Hart |
| 2003/0156367 A1 | 8/2003 | Macbeth |
| 2003/0200038 A1 | 10/2003 | Schweitzer |
| 2003/0212515 A1 | 11/2003 | Fletcher |
| 2004/0153215 A1 | 8/2004 | Kearney |
| 2005/0289407 A1 | 12/2005 | Noda |
| 2005/0289442 A1 | 12/2005 | Derner |
| 2006/0114627 A1 | 6/2006 | Wong |
| 2006/0215335 A1 | 9/2006 | Deshpande |
| 2007/0208981 A1 | 9/2007 | Restrepo |
| 2007/0300121 A1 | 12/2007 | Cooper |
| 2008/0080114 A1 | 4/2008 | Schweitzer |
| 2008/0155293 A1 | 6/2008 | Skendzic |
| 2008/0252631 A1 | 10/2008 | Hori |
| 2008/0255709 A1* | 10/2008 | Balgard et al. ............ 700/292 |
| 2008/0285623 A1 | 11/2008 | Petruzzi |
| 2009/0231769 A1 | 9/2009 | Fischer |
| 2010/0066381 A1 | 3/2010 | Mousavi |
| 2011/0068803 A1 | 3/2011 | Calero |
| 2012/0063039 A1 | 3/2012 | Shah |

FOREIGN PATENT DOCUMENTS

| | | |
|---|---|---|
| JP | 2044921 | 2/1990 |
| WO | 03032159 | 4/2003 |
| WO | 2003032159 | 4/2003 |

OTHER PUBLICATIONS

Nahmsuk OH, Philip P. Shirvani, and Edward J. McCluskey, Technical Report—Center for Reliable Computing, Error Detection by Duplicated Instructions in Super-scalar Processors, Apr. 2005.

Van Der Merwe, Cloete and Fischer, Implementation of an Unconventional Voltage Slide Scheme, Schweitzer Engineering Laboratories, Inc. Pullman, WA , Oct. 2004.

Wikipedia, Hamming Code http://en.wikipedia.org/wiki/Hamming_code, Jun. 12, 2006.

PCT/US2007/020385 Patent Cooperation Treaty, From the International Bureau, PCT Notification Concerning Transmittal of International Preliminary Report on Patentability , (Chapter 1 of Patent Cooperation Treaty), Date of Mailing Apr. 9, 2009, Applicant: Schweitzer Engineering Laboratories, Inc.

PCT/US2007/020408 Patent Cooperation Treaty, From the International Bureau, PCT Notification Concerning Transmittal of International Preliminary Report on Patentability, (Chapter 1 of Patent Cooperation Treaty), Date of Mailing Apr. 9, 2009, Applicant: Schweitzer Engineering Laboratories, Inc.

\* cited by examiner

LEVERAGING INHERENT REDUNDANCY IN A MULTIFUNCTION IED

TECHNICAL FIELD

This disclosure relates to multifunction protection devices. More particularly, this disclosure relates to use of redundant data provided to an intelligent electronic device to verify the detection of electrical disturbances.

BRIEF DESCRIPTION OF THE DRAWINGS

Non-limiting and non-exhaustive embodiments of the disclosure are described, including various embodiments of the disclosure with reference to the figures, in which.

Figure 1:
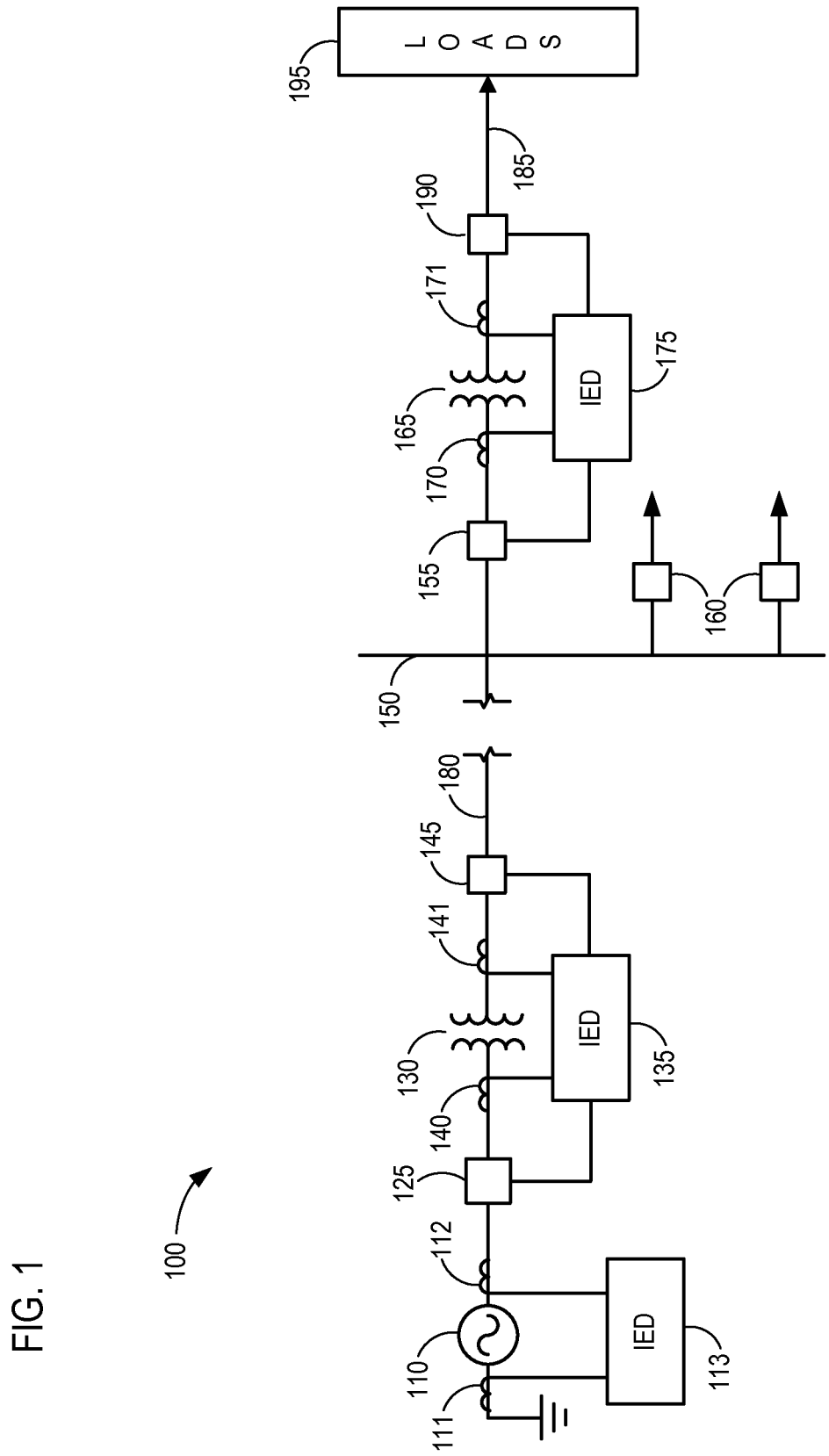
FIG. 1 illustrates a simplified one-line diagram of an electric power delivery system monitored by multiple intelligent electronic devices (IEDs).

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric power delivery systems (transmission, distribution, and the like) are subject to faults, which may include one or more phases electrically connected to each other and/or ground. Protection of electric power delivery systems may require a determination of which phase or phases are involved in the fault. Certain fault conditions, for example high-resistive faults, may complicate proper fault determination. Electric power generation, transmission, and delivery systems may utilize intelligent electronic devices (IEDs) to monitor for faults on electrical equipment such as transmission lines, distribution lines, buses, transformers, capacitor banks, generators, tap changers, voltage regulators, or the like. IEDs may further be configured to issue control instructions to equipment upon the detection of a fault.

An IED, such as a protective relay, may monitor and protect an electrical power system in the event of power system faults. In response to detecting a fault condition, the IED may take one or more protective measures (e.g., trip breakers), which may cause service disruptions within the electrical power system, such as loss of power to the service area of the electrical power system, low-voltage conditions (e.g., brown out), increases in the burdens on other portions of the power system, and so on. Accordingly, the costs associated with misoperation of the IED (false tripping) may be significant. Some IEDs may be complex devices operating in an interconnected network. With the increasing complexity of IEDs comes an increased risk of misoperation. It has been observed that IED misoperation may occur for any number of reasons, including, but not limited to: failures in IED componentry, such as processor(s), memory, computer-readable media, electrical interconnects, communication interfaces, and the like; failures in electrical components, such as operational amplifiers, analog-to-digital converters (ADCs), capacitors, inductors, and the like; soft errors due to software and/or firmware faults, compiler errors, processor errors, and the like.

Some IEDs may incorporate self-testing and/or self-validation components, such as processor watchdogs, to help prevent misoperation. However, these components are subject to failure just as the other components of the IED. Moreover, since the monitoring devices are typically incorporated into the IED, a failure within the IED may also cause a failure in the monitoring component(s). In another approach, an electrical power system may be monitored by two redundant IEDs, the outputs of which may be cross-validated to ensure that both are operating properly. This configuration, however, may increase the likelihood of IED failure since the combination results in a system that is roughly twice as complex as a single IED (the failure rate may be approximately double that of a single IED). Moreover, since a failure in either IED may cause a self-test alarm and take the IEDs out of service, availability is likely to be significantly reduced.

Prior to the introduction of microprocessor-based IEDs, electric power delivery systems were monitored by discrete analog protective elements. Each protective element may be configured to monitor a single component or point in the electric power delivery system. Each protective element may receive inputs from independent measurement devices, such as current transformers (CTs), voltage transformers (VTs), temperature sensors, light sensors (such as arc-flash detection sensors), and/or other monitoring and/or detection devices. For example, a generator may have been monitored by numerous protective elements, including, but not limited to, protective elements configured to perform the function of a differential protective element (ANSI device number 87), a phase-balance element (ANSI device number 46), a directional power element (ANSI device number 32), a Volts-per-Hertz element (ANSI device number 24), an over- or under-voltage/current element (ANSI device number 27, 51, 59, 67, and/or 76), a loss-of-field element (ANSI device number 40), a distance element (ANSI device number 21), an open current transformer detection module, an instantaneous overcurrent element (ANSI device number 50), and/or any other monitoring or protection element, with or without an assigned ANSI device number.

Each protective element monitoring the generator may receive electrical measurements from discrete CTs and/or VTs. Accordingly, the generator (or other electrical component) may include a relatively large number of electrical measurement devices. The advent of the microprocessor based IEDs allowed a single device, the IED, to receive a plurality of electrical measurement inputs and perform the function of numerous protective elements simultaneously. For example, rather than using a phase-balance element with a first set of electrical measurement inputs and a differential protective element with a second set of electrical measurement inputs, a single IED may receive the first and second sets of electrical measurement inputs and perform the function of both protective elements.

An IED performing the function of multiple protective elements may receive a plurality of inputs originally made available by the generator for use by a plurality of discrete protective elements. Given that some of the protective elements may have used electrical measurements from electrically equivalent points within the electric power delivery system, the IED may receive numerous redundant electrical measurement inputs. An IED may utilize the redundant electrical measurements to verify the detection of electrical disturbances, such as a fault, by the primary protection modules of the IED. In some embodiments, an electrical disturbance may be reported (such as by tripping a breaker) only when the primary protection module indicates an electrical disturbance and when a redundant protection module indicates an electrical disturbance. Accordingly, the presently described systems and methods may reduce or eliminate IED misoperation due to erroneous input signals. Additionally, the presently described systems and methods may provide additional information to an operator regarding the reason an IED tripped a breaker or otherwise indicated that an electrical disturbance occurred.

According to various embodiments, an IED may be configured with a first protection module configured to perform the function of a first protective element and a second protection module configured to perform the function of a second protective element. The first protection module may utilize a first subset of a plurality of electrical measurement inputs in order to perform its protective function. The second protection module may utilize a second subset of the plurality of electrical measurement inputs in order to perform its protective function. A redundant protection module may utilize at least a portion of the second subset of the plurality of electrical measurement inputs to verify the detection of an electrical disturbance by the first protection module. Accordingly, by taking advantage of the existence of redundant electrical measurement inputs, the IED is able to verify the detection of electrical disturbances without requiring measurement inputs beyond to what is already available to the IED.

According to various embodiments, the plurality of electrical measurements may be associated with a generator, a transformer, a transmission line, a distribution line, or other component in an electric power delivery system. In the following examples, the primary protection modules may utilize a first subset of electrical measurement inputs to detect a first type of electrical disturbance. The redundant protection module may utilize a second subset of electrical measurement inputs to verify the detection of the first type of electrical disturbance. The second subset of electrical measurement inputs may be used by one or more additional primary protection modules to detect additional types of electrical disturbances.

The primary protection module may include a current differential element for a generator stator windings and the redundant protection module may determine when a current differential exists between various phase conductors or windings. The primary protection module may be a phase-balance current element and the redundant protection module may determine a difference between the negative-sequence current on the terminals of the machine and the negative-sequence current on neutral side of the machine. The primary protection module may be a directional power element and the redundant protection module may determine a difference between the per-phase power between a first phase line and a second phase line and the per-phase power between the second phase line and a third phase line. The primary protection module may be a Volts-per-Hertz element monitoring a first phase line, and the redundant protection may be a volts-per-Hertz element monitoring a second phase line. The primary protection module may be an over-voltage element configured to detect an over-voltage on a first phase line and the redundant protection module may be a second over-voltage element configured to detect an over-voltage on a second phase line. The primary protection module may be an over-current element configured to detect an over-current on a first phase line and the redundant protection module may be a second over-current element configured to detect an over-current on a second phase line.

The primary protection module may be a loss of excitation element and the redundant protection module may be a negative sequence voltage detector and a negative sequence current detector. The primary protection module may be a distance element and the redundant protection module may be configured determine a difference between the negative-sequence current on the machine terminals and the negative-sequence current on a neutral side of the machine. The primary protection module may be an overcurrent element and the redundant protection module may be configured to determine an increase in a differential current and determine a decrease in a restraint current, such that the redundant protection module detects an open current transformer when the increase in the differential current and the decrease in a restraint current are approximately equivalent, and the determined values for the differential current and the restraint current are above a predetermined threshold.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, an "embodiment" may be a system, a method, or a product of a process.

As used herein, the term IED may refer to any microprocessor-based device that monitors, controls, automates, and/or protects monitored equipment within a system. Such devices may include or perform the function of, for example, remote terminal units, differential elements, distance elements, directional elements, feeder elements, overcurrent elements, voltage regulator controls, voltage elements, breaker failure elements, generator elements, motor elements, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc., that performs one or more tasks or implements particular abstract data types.

Some of the infrastructure that can be used with embodiments disclosed herein is already available, such as general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

The embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In other instances, well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1 illustrates one embodiment of a diagram of an electric power delivery system 100. Electric power delivery system 100 may include a plurality of IEDs 113, 135, and 175 configured to monitor, control, and/or protect various components of the electric power delivery system 100. The electric power delivery system 100 may also include generator 110 configured to generate electric power. As illustrated, generator 110 may feed step-up transformer 130 to step up the voltage on transmission line 180 for distribution via bus 150 and transmission line 185. As illustrated, transmission line 185 may supply power to loads 195 via transformer 165.

Other IEDs (not shown) may be used to monitor, control, and/or protect various conductors, transformers, generators, buses, capacitor banks, circuit breakers, switches, voltage regulators, loads, batteries, and the like. Each IED may be in communication with one or more other IEDs. Some IEDs may be configured as central controllers, synchrophasor vector processors, automation controllers, programmable logic controllers, real-time automation controllers, SCADA systems, or the like.

According to various embodiments, electrical power delivery system 100 may generate, transmit, and distribute three-phase power. Alternatively, electrical power delivery system 100 may be adapted to accommodate any number of phases, including single phase, two-phase, three-phase with a neutral line, three-phase without a neutral line, or a combination thereof.

Electric power delivery system 100 may include various breakers 125, 145, 155, 160, and 190 controlled by any of IEDs 113, 135, and 175. One or more of breakers 125, 145, 155, 160, and 190 may be opened when any of IEDs 113, 135, and 175 detects an electrical disturbance, such as a fault condition. Each IED 113, 135, and 175 may monitor a component or portion of electric power delivery system 100 via one or more CTs and/or VTs, such as illustrated CTs 111, 112, 140, 141, 170, and 171. Each IED 113, 135, and 175 may be configured with one or more protection modules configured to detect specific electrical disturbances. For example, IED 113 configured to monitor and protect generator 110 by performing the function of any of a wide variety of detection elements, such as those elements and devices described in IEEE C37.2 (last revised in 2008). IED 113 may include numerous primary protection modules each configured to perform the function of a protective element. In addition IED 113 may include one or more redundant protection modules configured to verify the detection of an electrical disturbance by one of the primary protection modules.

Figure 2:
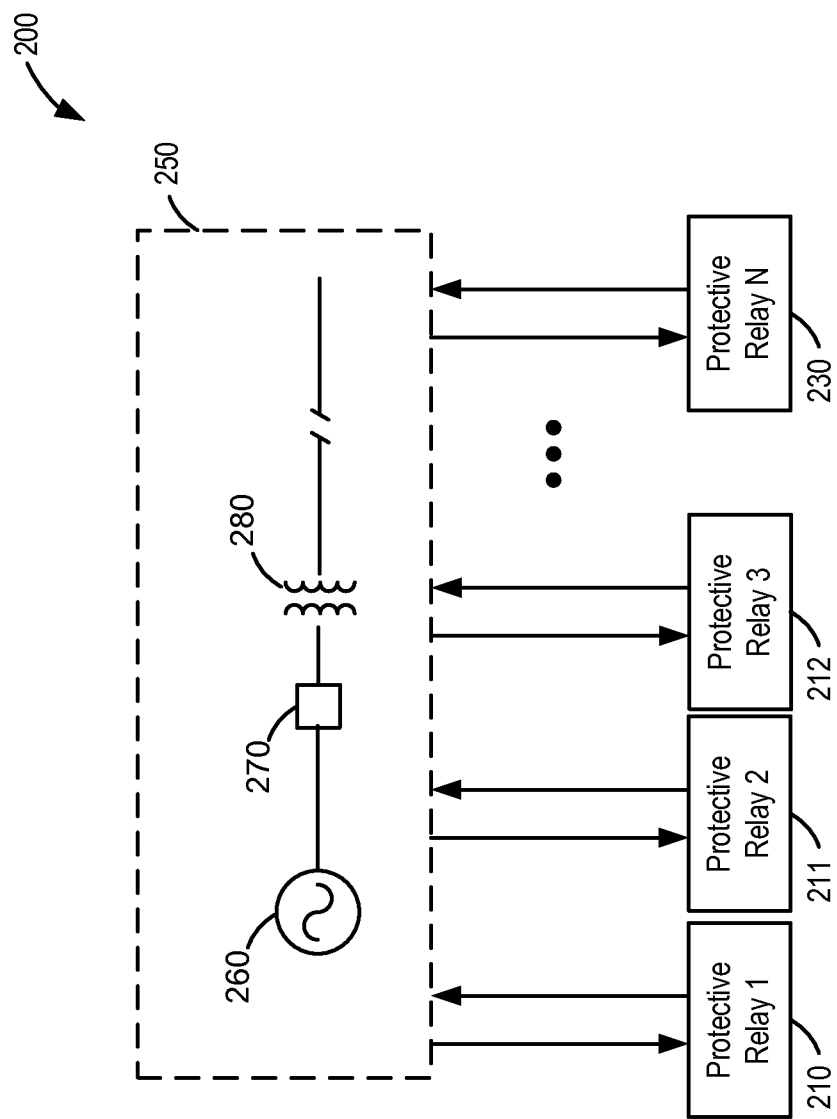
FIG. 2 illustrates a simplified one-line diagram of an electric power delivery system monitored by multiple, discrete protective elements, each protective element receiving inputs from current and/or voltage sensors.

FIG. 2 illustrates a simplified one-line diagram 200 of an electric power delivery system 250 monitored by multiple single-function protective elements 210, 211, 212, and 230. As illustrated, electric power delivery system 250 may include a generator 260, a breaker 270, and a transformer 280. As may be appreciated by one of skill in the art, the illustrated electric power delivery system 250 is merely a simplified representation of a power delivery system. In practice, such a delivery system would include a wide variety of additional components and connections. Various components of electric power delivery system 250 may be monitored, protected, and/or controlled by single-function protective elements 210-

230. As illustrated, any number of protective elements may be utilized to monitor any number of components. According to various embodiments, each protective element 210-230 may perform a discrete protective function. Additionally, each protective element 210-230 may receive electrical measurement inputs specific to its indented function. For example, generator 260 may be monitored, protected, and/or controlled by numerous single-function protective elements, each of which may receive a discrete set of electrical measurement inputs. Each protective element 210-230 may perform a discrete function, such as, but not limited to, those described in IEEE C37.2.

Figure 3A:
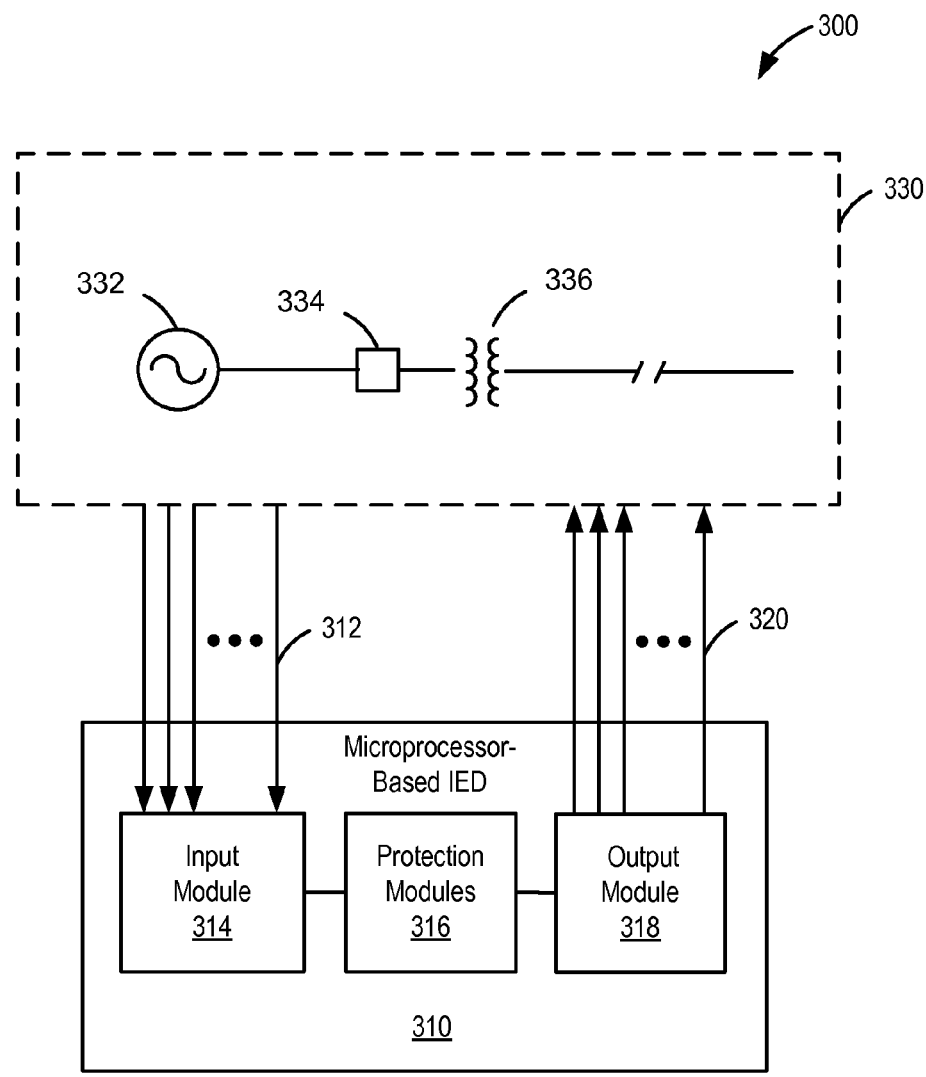
FIG. 3A illustrates a simplified one-line diagram of an electric power delivery system monitored by a microprocessor-based IED.

FIG. 3A illustrates a simplified one-line diagram 300 of an electric power delivery system 330 monitored by a microprocessor-based IED 310. As illustrated, instead of utilizing a plurality of discrete protective elements, one or more IEDs may be used to monitor, protect, and/or control electric power delivery system 330. According to various embodiments, IED 310 may perform the functions that were traditionally assigned to a plurality of discrete protective elements. For example, a single IED, such as IED 310, may be configured to monitor generator 332. Another IED may be configured to monitor transformer 336. IED 310 may actuate breaker 334 if an electrical disturbance is detected.

All of the electrical measurement inputs 312 originally available to protective elements 210-230 in FIG. 2 may be made available to IED 310 via input module 314. Accordingly, IED 310 may include various protection modules 316. Each protection module 316 may be configured to perform the function of one or more of the protective elements 210-230 in FIG. 2. In various embodiments, some of electrical measurement inputs 312 may be redundant. Where discrete protective elements 210-230 in FIG. 2 did not utilize the existing redundancy in the complete set of available electrical measurement inputs 312, IED 310 may leverage the existing redundancy in the complete set of electrical measurement inputs 312. Output module 318 may provide control and/or feedback signals 320 to electric power delivery system 330 when an electrical disturbance is detected by one of protection modules 316.

Figure 3B:
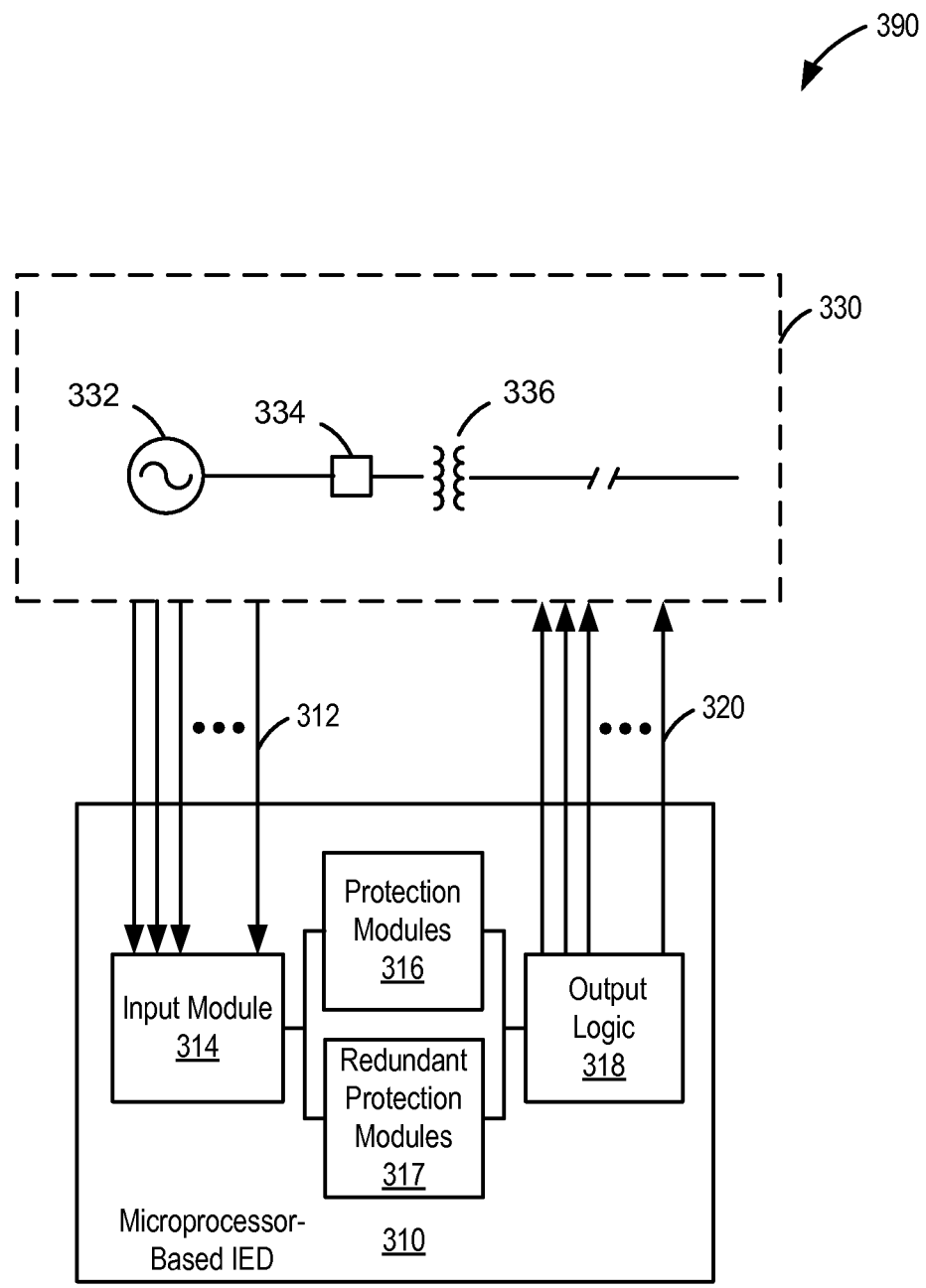
FIG. 3B illustrates a simplified one-line diagram of an electric power delivery system monitored by an IED configured with redundant protection modules.

As previously described, IED misoperation is undesirable and may result in additional complications and/or costs. Accordingly, as illustrated in FIG. 3B, IED 310 may utilize the redundant electrical measurements 312 to verify the detection of electrical disturbances by protection modules 316. Each of the plurality of protection modules 316 may perform the function of a protection element and it's supervising logic. For example, a protection module may perform the function of a current differential element at it supervising logic. Redundant protection modules 317 may include various protection modules and/or redundant supervising logic configured to verify the detection of electrical disturbances using the redundant electrical measurement inputs 312.

In one example, protection module 316 may include a current differential element configured to determine when a current differential of a first phase line and a second phase line is greater than a predetermined threshold. Any detected electrical disturbances may be verified by a redundant protection module 317 configured to determine when a current differential between a third phase line and one of the first and second phase lines is greater than the predetermine threshold. Accordingly, output logic 318 may indicate an electrical disturbance exists when both the primary protection module 316 and the redundant protection module 317 detect a current differential greater than the predetermined threshold.

Since electrical measurement inputs 312 inherently include redundant measurement inputs, as commonly exists in practice, it is not necessary to add new measurement inputs or sensors to electrical power delivery system 330. Rather, the existing redundancy in multifunction generator (or other component) IEDs is leveraged in order to provide redundant verification of detected electrical disturbances. According to various embodiments, leveraging the redundant electrical measurement inputs 312 may reduce or eliminate IED misoperation.

As described herein, protection modules 316 may include any of a wide variety of protection modules and may be configured to monitor any of a wide variety of electrical components in electric power delivery system 330. Redundant modules 317 may include any number of redundant protection modules, each configured to verify the detection of an electrical disturbance by at least one of the protection modules 316.

Figure 4:
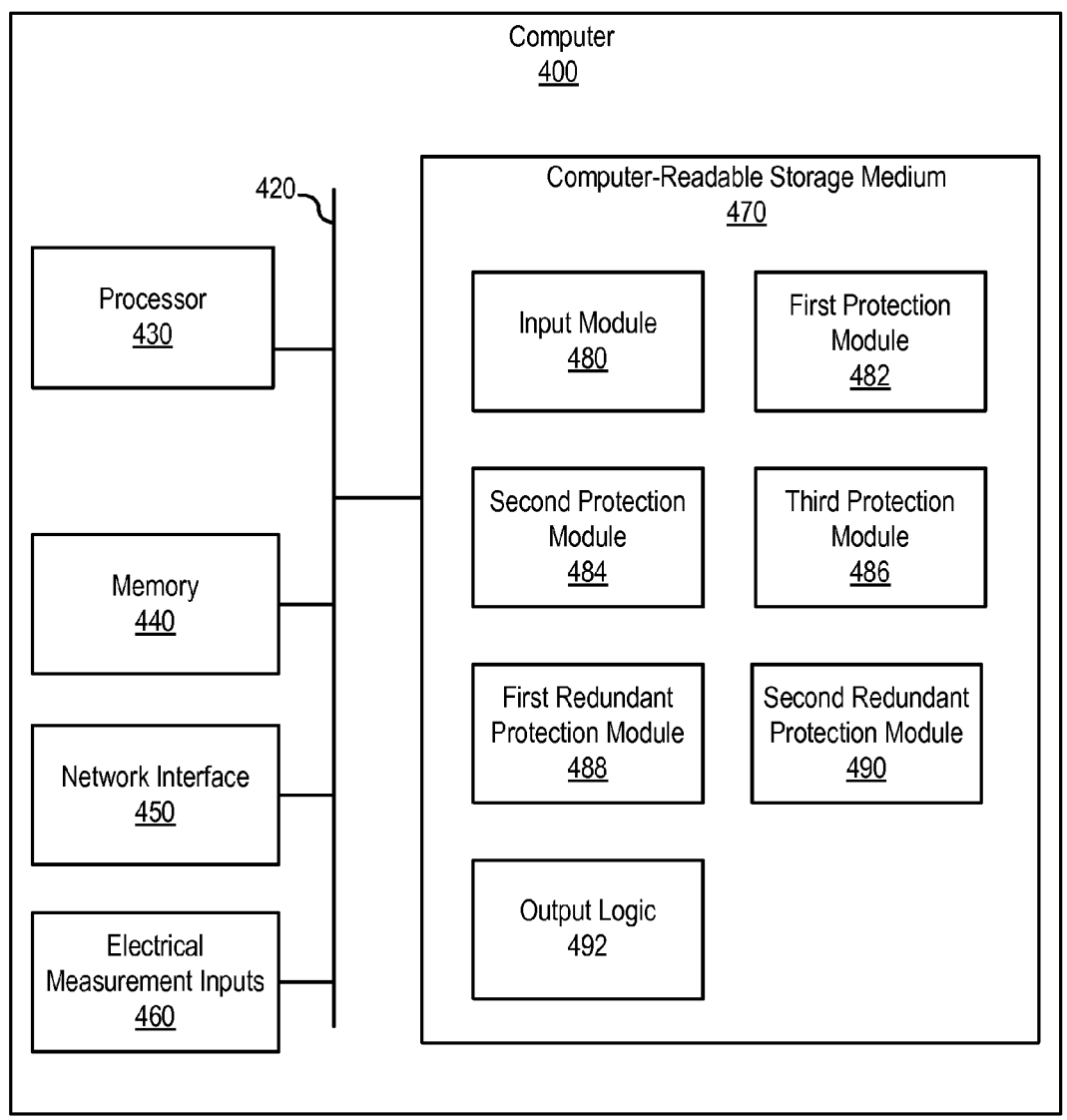
FIG. 4 illustrates a functional block diagram of a computer system acting as an IED with at least two protection modules and at least one redundant protection module.

FIG. 4 illustrates a functional block diagram of a computer system 400 acting as an IED with at least two protection modules 482 and 484 and at least one redundant protection module 488. As illustrated, computer system 400 may include a processor 430, memory (such as RAM) 440, a network interface 450, and electrical measurement inputs 460 connected via bus 420. In some embodiments, electrical measurement inputs 460 may be omitted and network interface 450 may receive electrical measurement input data. Bus 420 may also connect computer-readable storage medium 470. Computer-readable storage medium 470 may include various modules, such as input module 480, first protection module 482, second protection module 484, third protection module 486, first redundant protection module 488, second redundant protection module 490, and output logic 492.

According to various embodiments, input module 480 may be configured to receive data regarding a plurality of electrical measurement inputs. First protection module 482 may be configured to analyze a first subset of the plurality of electrical measurement inputs 460 to detect electrical disturbances of a first type. For example, first protection module 482 may be (i.e. perform the function of) a distance element (ANSI device number 21). Second protection module 484 may be configured to analyze a second subset of the plurality of electrical measurement inputs 460 to detect electrical disturbances of a second type. Third protection module 486 may be configured to analyze a third subset of the plurality of electrical measurement inputs 460 to detect electrical disturbances of a third type.

First redundant protection module 488 may be configured to verify the detection of the first type of electrical disturbance by first protection module 482 using at least some of the second and/or third subsets of the plurality of electrical measurements. Second redundant protection module 490 may be configured to verify the detection of the second type of electrical disturbance by second protection module 484 using at least some of the first and/or third subsets of the plurality of electrical measurements. Output logic 492 may be configured to indicate an electrical disturbance exists when a primary protection module (such as first, second, and/or third protection modules 482-486) detects an electrical disturbance and a corresponding redundant protection module (such as first and/or second redundant protection modules 488 and 490) verifies the detection of the electrical disturbance by the primary protection module.

FIGS. 5-13 illustrate various embodiments of primary protection modules as individual blocks implementing one or more of the protective functions described in IEEE C37.2 and logical diagrams for various corresponding redundant protection modules. As may be appreciated by one of skill in the art, an IED may be configured to perform one or more of the functions of the primary protection modules illustrated in FIGS. 5-13. The IED may also be configured to perform one or more of the functions of the redundant protection modules.

For example, an IED may receive a plurality of electrical measurement inputs. A first primary protection module (any of the primary protection modules in FIGS. 5-13) may be configured to detect a first type of electrical disturbance using a first subset of the plurality of electrical measurements. A second primary protection module (another one of the primary protection modules in FIGS. 5-13) may be configured to detect a second type of electrical disturbance using a second subset of the plurality of electrical measurements. Additional primary protection modules may utilize additional subsets of the plurality of electrical measurements. A redundant protection module may utilize any of the second, third, fourth, . . . nth subsets of the plurality of electrical measurements to verify the detection of an electrical disturbance by the first primary protection module. Additional redundant protection modules may utilize any number of available electrical measurements to verify the detection of electrical disturbances by any of the primary protection modules using any of the subsets of the plurality of electrical measurements, except the subset used by the corresponding primary protection module.

Specific examples of primary protection modules and corresponding redundant protection modules are provided in FIGS. 5-13. The specific examples included below are not exhaustive. In fact, the presently described systems and methods for verifying detected electrical disturbances using the redundantly available electrical measurements in an IED may utilize be applicable to a wide variety of protection, monitoring, and/or control elements and/or other devices.

Figure 5:
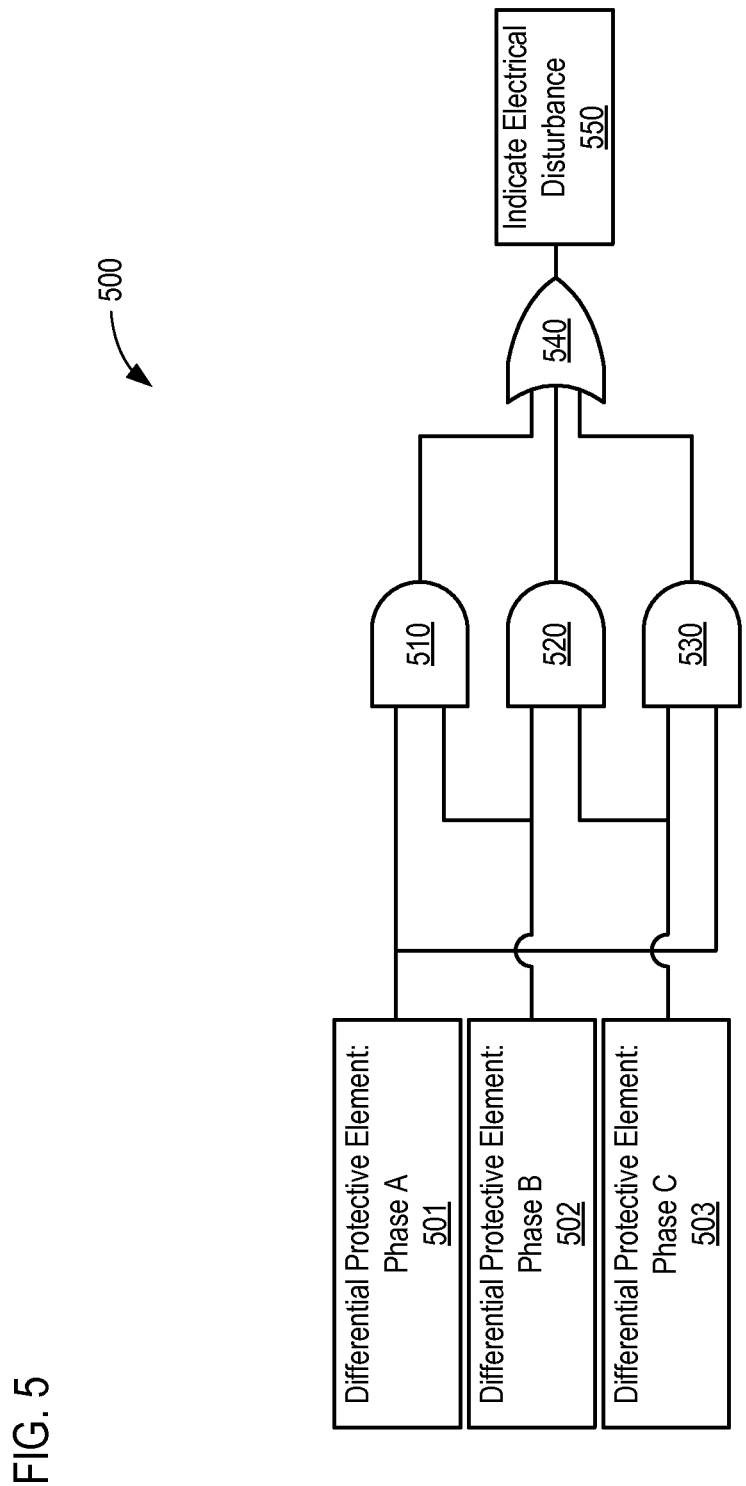
FIG. 5 illustrates a redundant protection module configured to verify an electrical disturbance detected by a differential protective element.

FIG. 5 illustrates a redundant protection module 500 configured to verify an electrical disturbance detected by a differential protective element 501. As illustrated, each of primary protective elements 501, 502, and 503 may include a differential protective element configured to determine a current unbalance between two or more currents, such as the terminal and neutral side currents of a generator. Redundant protective module 500 may require operation of at least two of the three phase elements, leveraging the fact that a phase to phase fault would activate at least two of the three differential elements 501, 502 and 503. Accordingly, rather than indicating an electric disturbance based, at 550, based on the output of one of differential protective elements 501, 502, and 503, redundant protective module 500 may require that at least two of differential protective elements 501, 502, and 503 detect electrical disturbances. Each of differential protective elements 501, 502, and 503 may be implemented as discrete protective elements and/or as protection modules in an IED. Accordingly, protection modules configured to implement the functions of differential protective elements 501, 502, and 503 and a redundant protection module implementing logic gates 510, 520, 530, and 540 may be incorporated into an IED.

Figure 6:
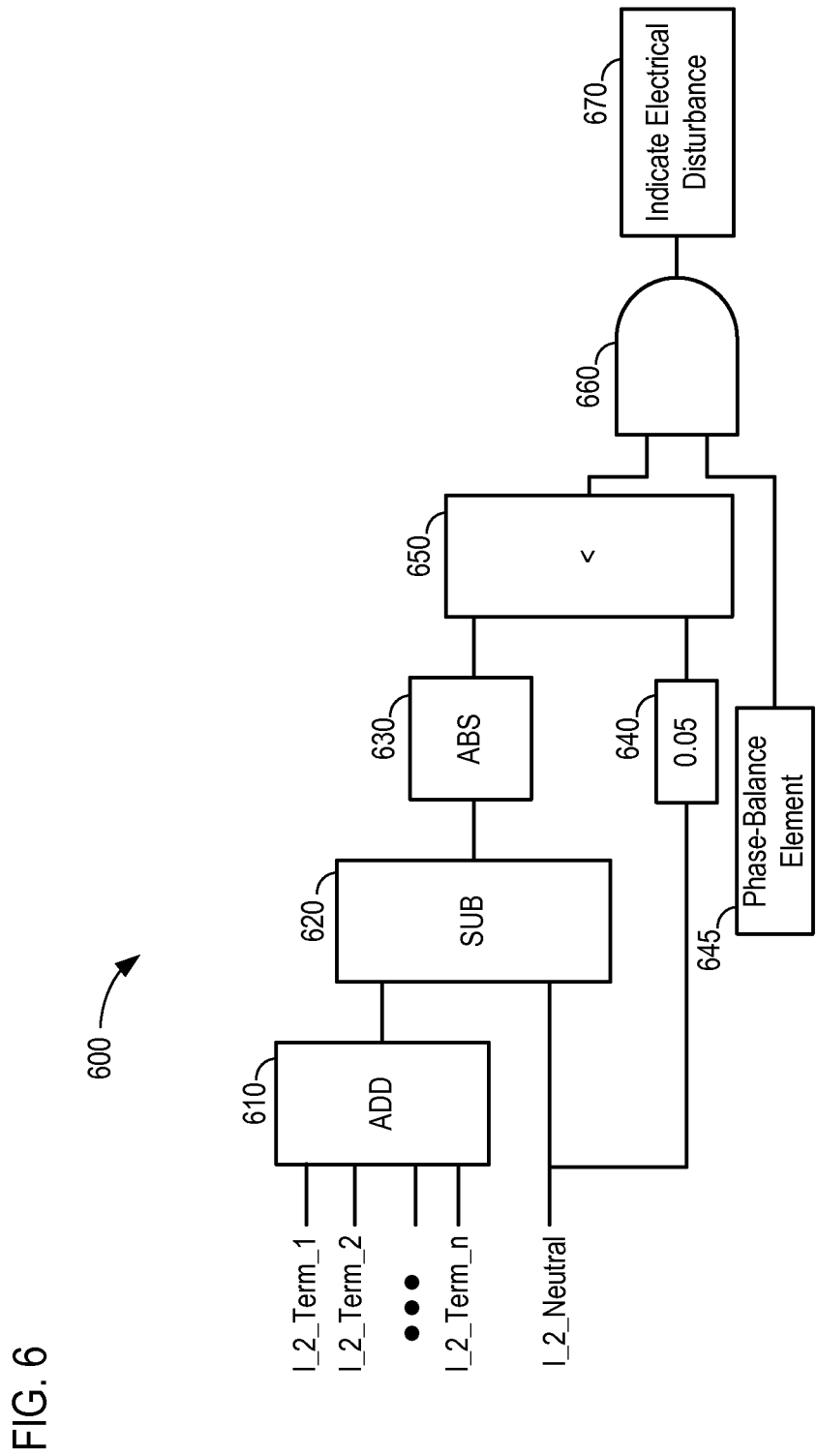
FIG. 6 illustrates a redundant protection module configured to verify an electrical disturbance detected by a phase-balance element.

FIG. 6 illustrates a redundant protection module 600 configured to verify an electrical disturbance detected by a phase-balance element 645. As illustrated, a protection module may include or implement the functions of a phase-balance element 645. The output may indicate an electrical disturbance when the phase-balance element 645 and, at 660, the redundant protection module 600 verifies the detection of the electrical disturbance. According to the illustrated embodiment, redundant protection module 600 may determine the difference between the negative-sequence current at the terminals of the machine and the negative-sequence current on the neutral side of the machine.

Accordingly, an electrical disturbance may be indicated, at 670, when phase-balance element 645 detects an electrical disturbance and, at 660, when the negative-sequence current on the machine terminals and the negative-sequence current on the neutral side are greater than a predetermined threshold. Phase-balance element 645 and/or the functions performed by the phase-balance element 645 may be implemented by an IED. Similarly, logic 610, 620, 630, 640, 650, and 660, implementing redundant protection module 600 may be implemented in an IED.

Figure 7:
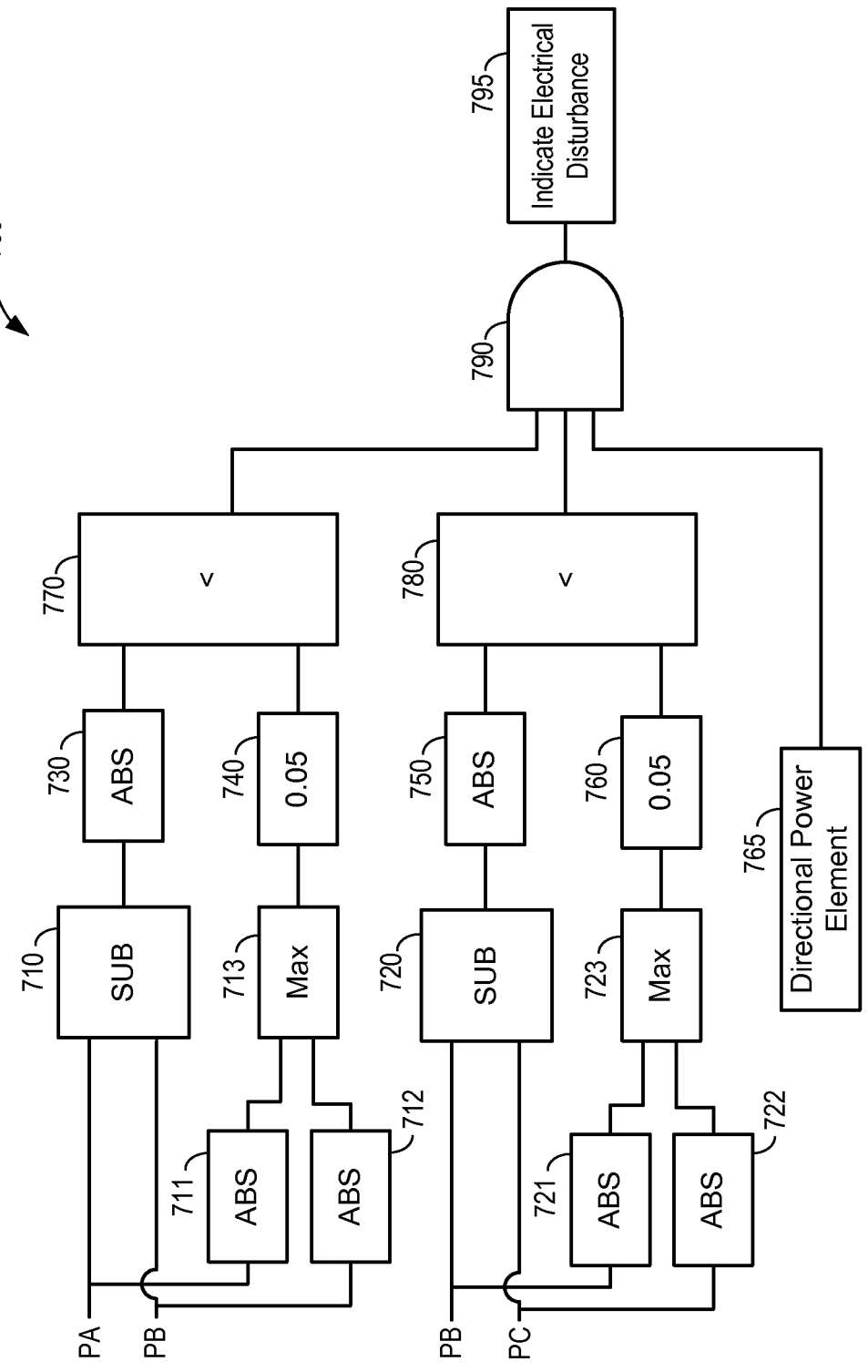
FIG. 7 illustrates a redundant protection module configured to verify an electrical disturbance detected by a directional power element.

FIG. 7 illustrates a redundant protection module 700 configured to verify an electrical disturbance detected by a directional power element 765. As illustrated, a protection module may include or implement the function of a direction power element 765. The output may indicate an electrical disturbance when the directional power element 765 and, at 790, the redundant protection module 700 verifies the detection of the electrical disturbance. According to the illustrated embodiment, redundant protection module 700 may determine the difference between the per-phase power of a first phase and a second phase, and the per phase power between the second phase and a third phase.

The output may indicate an electrical disturbance, at 795, when the directional power element 765 detects and electrical disturbance, when the difference in the per-phase power between the first phase and the second phase is above a predetermine threshold, and when the difference in the per-phase power between the second phase and the third phase is above a predetermined threshold. Direction power element 765 and/or the functions performed by the directional power element 765 may be implemented by an IED. Similarly, logic 710, 711, 712, 713, 720, 721, 722, 723, 730, 740, 750, 760, 770, 780, and 790, implementing redundant protection module 700 may be implemented in an IED.

Figure 8:
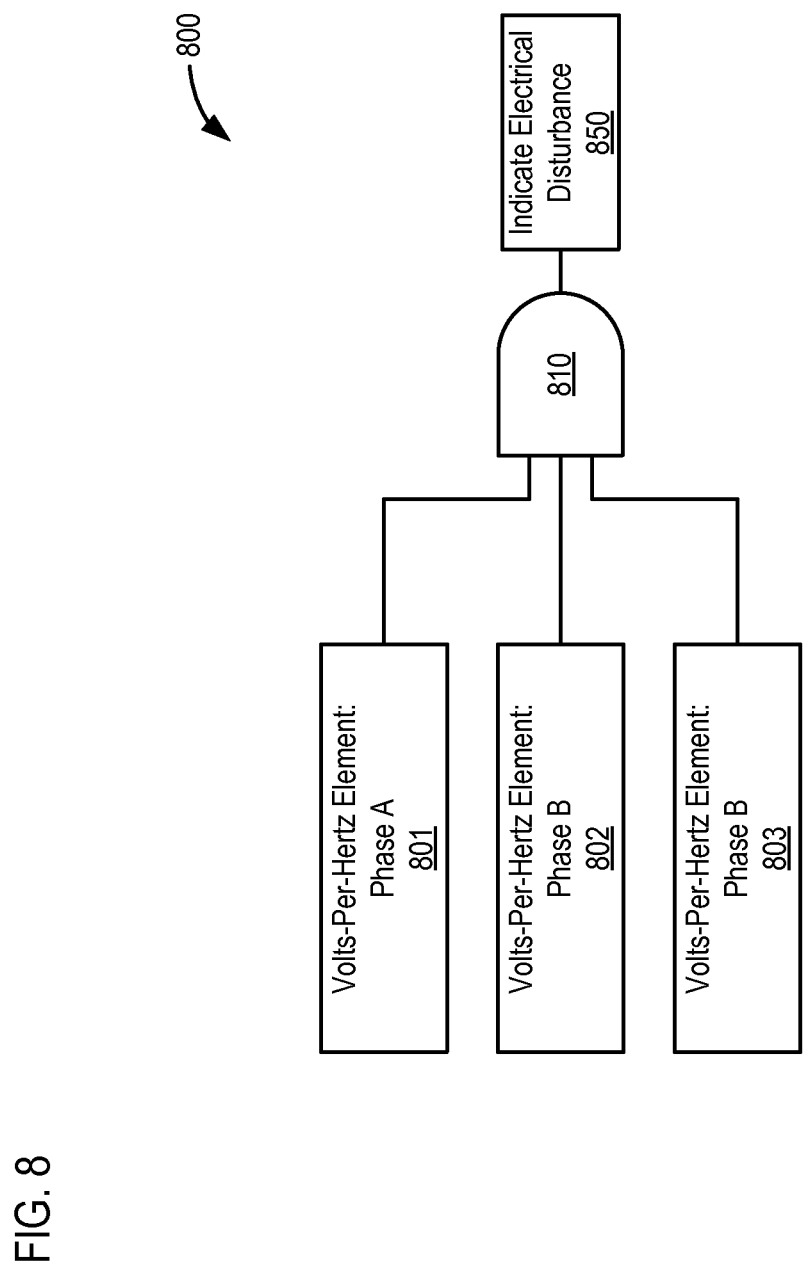
FIG. 8 illustrates a redundant protection module configured to verify an electrical disturbance detected by a Volts-per-Hertz element.

FIG. 8 illustrates a redundant protection module 800 configured to verify an electrical disturbance detected by a Volts-per-Hertz element 801, 802, and/or 803. As illustrated, the redundant protection module 800 may include logic 810 configured to require that at least two of Volts-per-Hertz elements 801, 802, and 803 detect an electrical disturbance. In such an embodiment, one or more of the Volts-per-Hertz element 801, 802, and/or 803 may be implemented as primary protection modules and a second or third Volts-per-Hertz element 801, 802, and/or 803 and logic 810 may be implemented as redundant protection module and/or as an output module. Volts-per-Hertz elements 801, 802, and 803, logic 810, and output module 850 and/or the function performed by them may be implemented in an IED.

Figure 9:
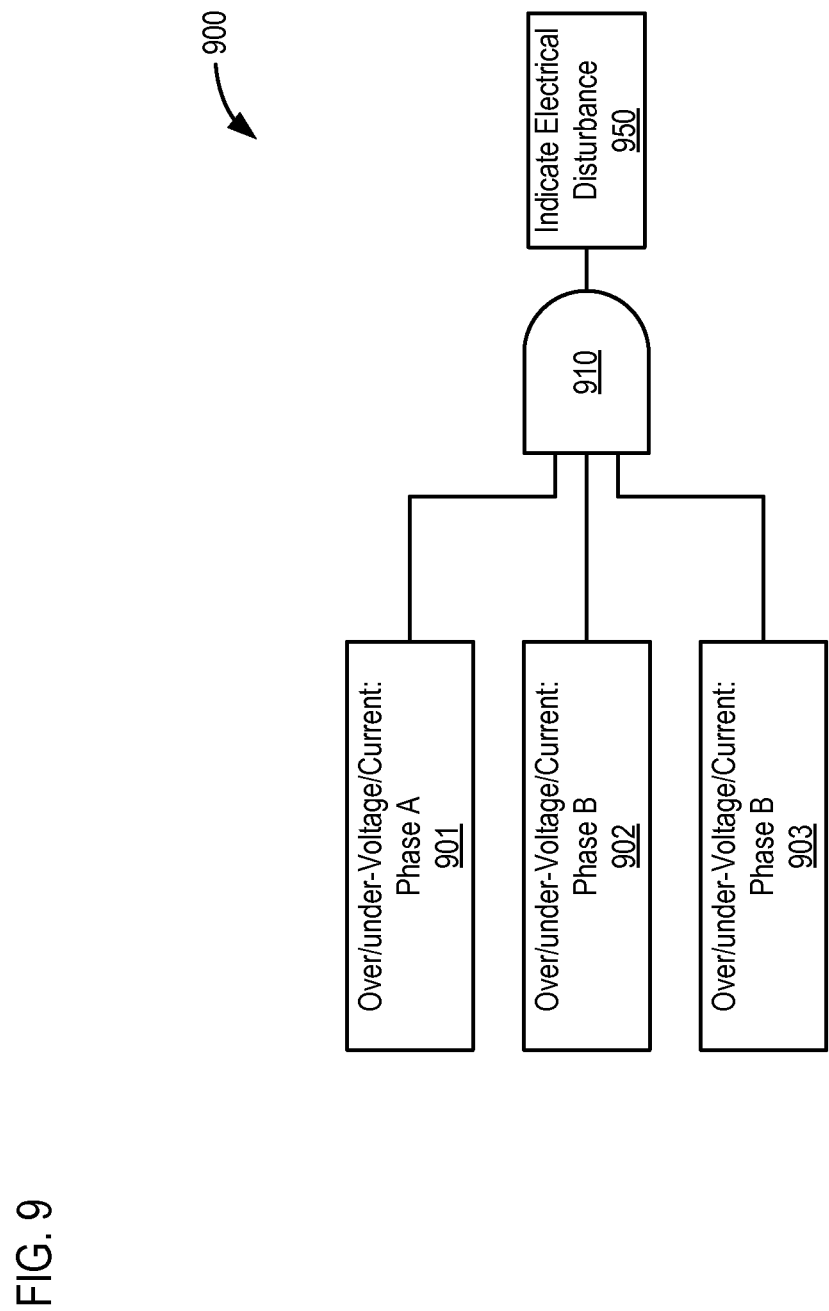
FIG. 9 illustrates a redundant protection module configured to verify an electrical disturbance detected by one or more of an overcurrent element, an undercurrent element, an overvoltage element, and an undervoltage element.

FIG. 9 illustrates a similar redundant protection module 900 configured to verify an electrical disturbance detected by one or more of an overcurrent element, an undercurrent element, an overvoltage element, and an undervoltage element (devices 901, 902, and 903). According to the illustrated embodiment, one or more of the devices 901, 902, and/or 903 may be a primary protection module and one or more of the remaining devices 901, 902, and/or 903 may be a redundant protection module in conjunction with logic 910. Accordingly, an output module may indicate an electrical disturbance, at 950, when a primary protection module (one of devices 901, 902, or 903) and a redundant protection module (another of devices 901, 902, and 903) detect an electrical disturbance.

Figure 10:
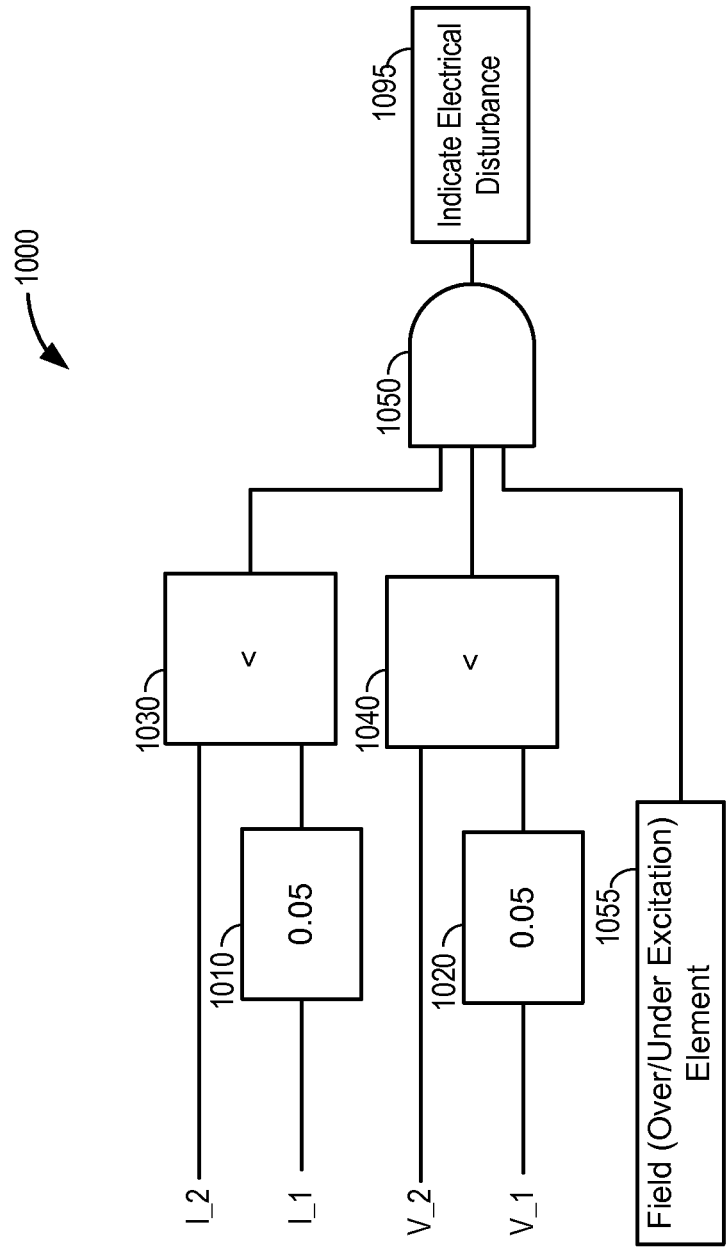
FIG. 10 illustrates a redundant protection module configured to verify an electrical disturbance detected by a field (over/under excitation) element.

FIG. 10 illustrates a redundant protection module 1000 configured to verify an electrical disturbance detected by a field (over/under excitation) element 1055 (such as a loss of excitation element). As in previously described embodiments, field element 1055 and/or the functions implemented by field element 1055 may be implemented by an IED. Field element 1055 may be considered a primary protection module and logic 1010, 1020, 1030, 1040, and 1050 may be considered a redundant protection module. The redundant protection module, comprising logic 1010, 1020, 1030, 1040, and 1050, may perform the function of a negative-sequence voltage detector and a negative-sequence current detector. An output module 1095 may indicate an electrical disturbance when the field element 1055 detects a loss of excitement, the negative-sequence voltage detector has a zero value (as would be expected during an actual loss-of-excitation event), and the negative-sequence current detector has a zero value (as would be expected during an actual loss-of-excitation event). The redundant protection module and/or the function performed by the redundant protection module may be implemented by an IED.

Figure 11:
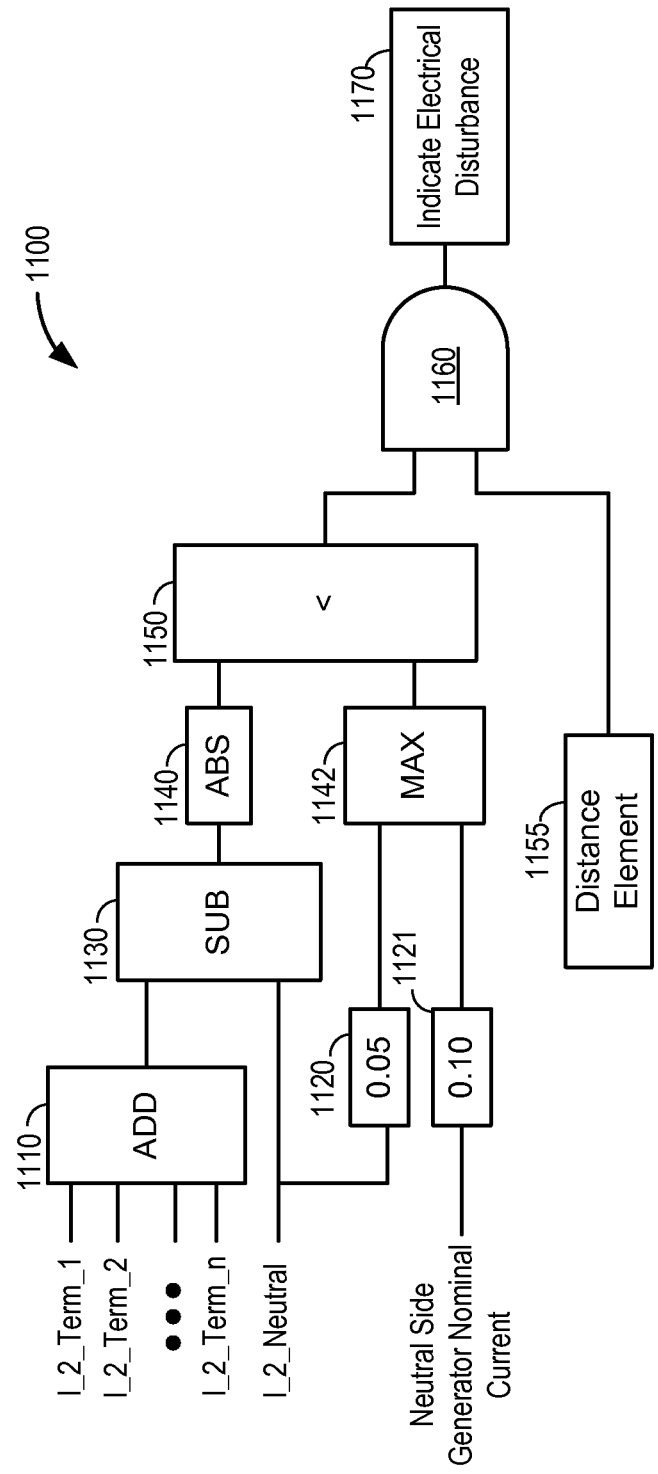
FIG. 11 illustrates a redundant protection module configured to verify an electrical disturbance detected by a distance element.

FIG. 11 illustrates a redundant protection module 1100 configured to verify an electrical disturbance detected by a distance element 1155. Similar to previous embodiments, distance element 1155 and/or the function performed by distance element may be implemented by an IED. Distance element 1155 may be part of a primary protection module. Logic 1110, 1120, 1130, 1140, and 1150 may determine a difference between the negative-sequence current on the phase lines and the negative-sequence current on the neutral line. If the difference is above a predetermine threshold, and, at 1160, distance element 1155 detects an electrical disturbance, then an output module 1170 may indicate an electrical disturbance. Logic 1110, 1120, 1121, 1130, 1140, 1142, 1150, and 1160 may be implemented in an IED.

Figure 12:
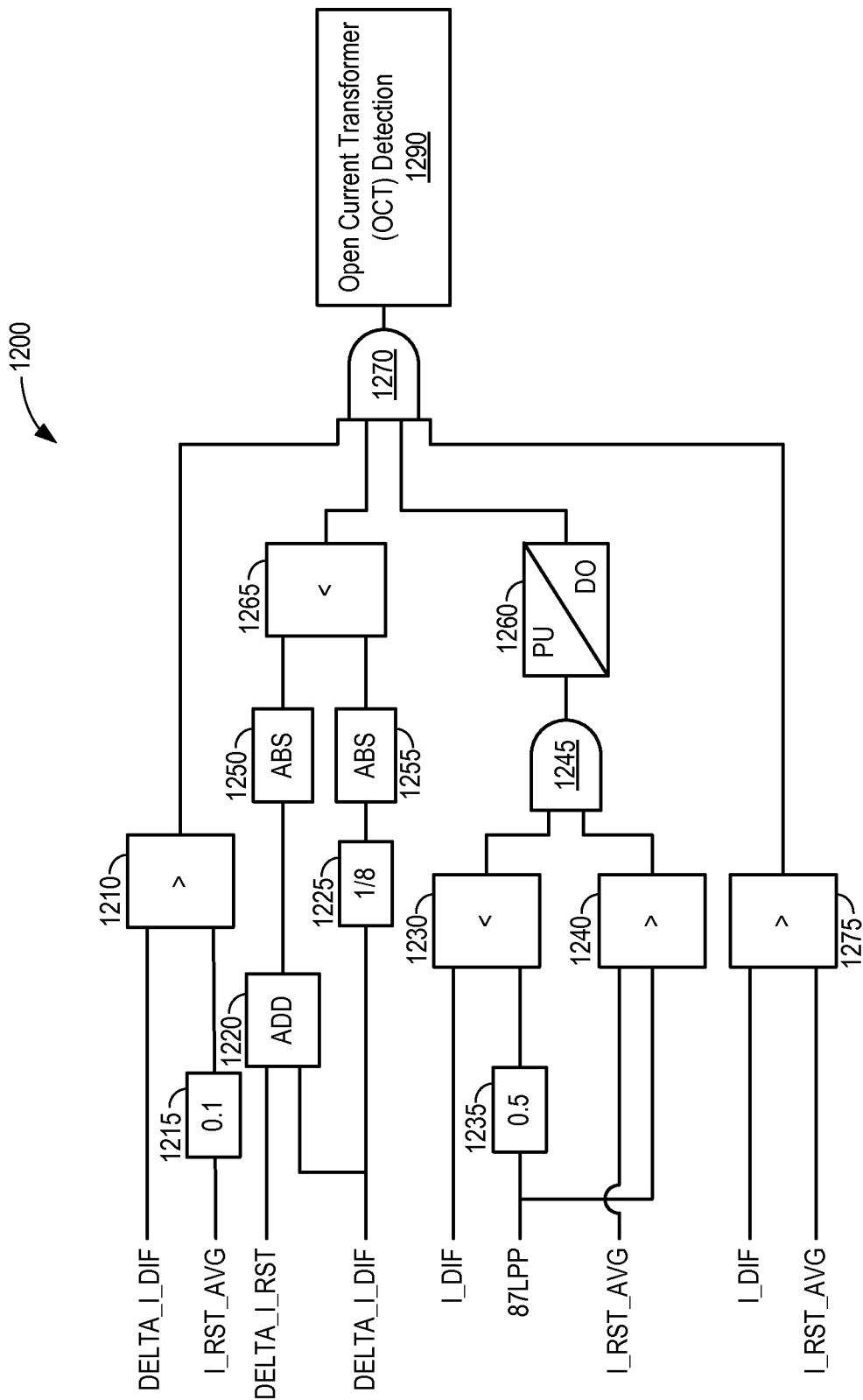
FIG. 12 illustrates a logic diagram of a module configured to detect an open current transformer.
Figure 13:
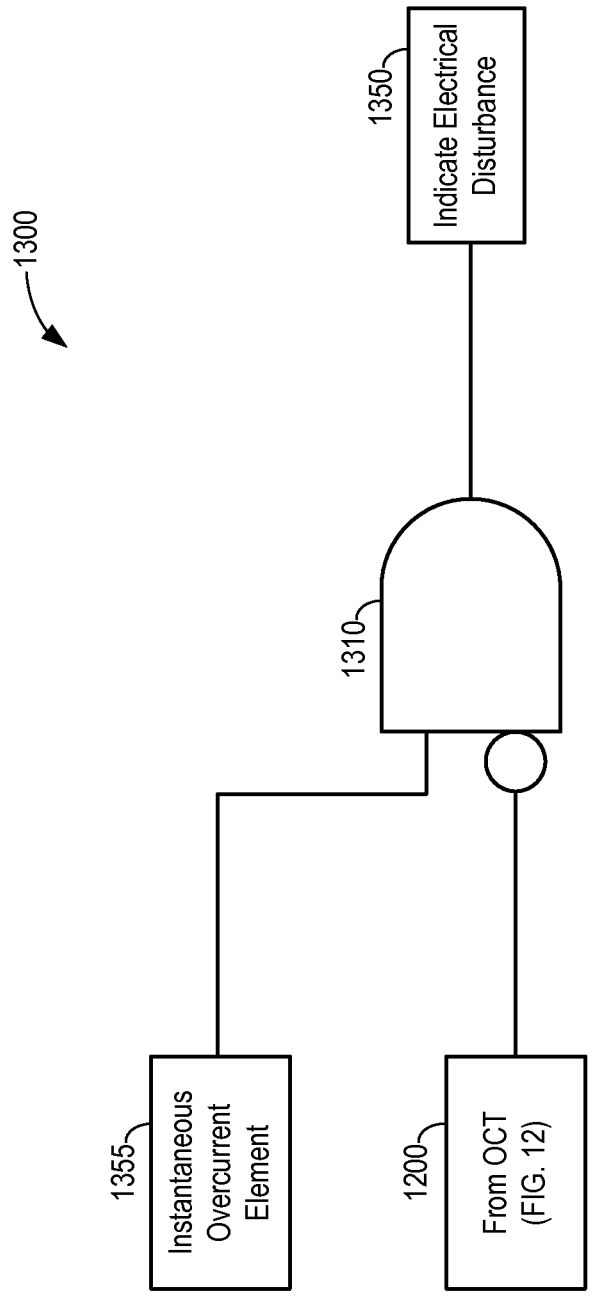
FIG. 13 illustrates a redundant protection module configured to verify an electrical disturbance detected by an instantaneous overcurrent element using the output from the open current transformer module of FIG. 12.

FIG. 12 illustrates a logic diagram of a module 1200 configured to detect an open current transformer. Module 1200 may be part of a redundant protection module, as illustrated in FIG. 13 below. Module 1200 may determine an increase in a differential current and determine a decrease in a restraint current. Module 1200 may detect an open current transformer when the increase in the differential current and the decrease in a restraint current are approximately equivalent, and the determined values for the differential current and the restraint current are above a predetermined threshold. Logic 1210, 1215 1220, 1225, 1230, 1235, 1240, 1245, 1250, 1255, 1260, 1265, 1270, and 1275 may be implemented in an IED.

As illustrated in FIG. 13, if module 1200 from FIG. 12 does not detect an open current transformer, at 1310, and an instantaneous overcurrent element 1355 detects an electrical disturbance, then output logic 1350 may indicate and electrical disturbance. Supervising the instantaneous overcurrent element constitutes the use of redundant measurements typically not applied by this element. Similar to previous embodiments, module 1200 in FIG. 12, instantaneous overcurrent element 1355, logic 1310, and output module 1350 may be included in and/or their respective functions may be performed by an IED.

Figure 14:
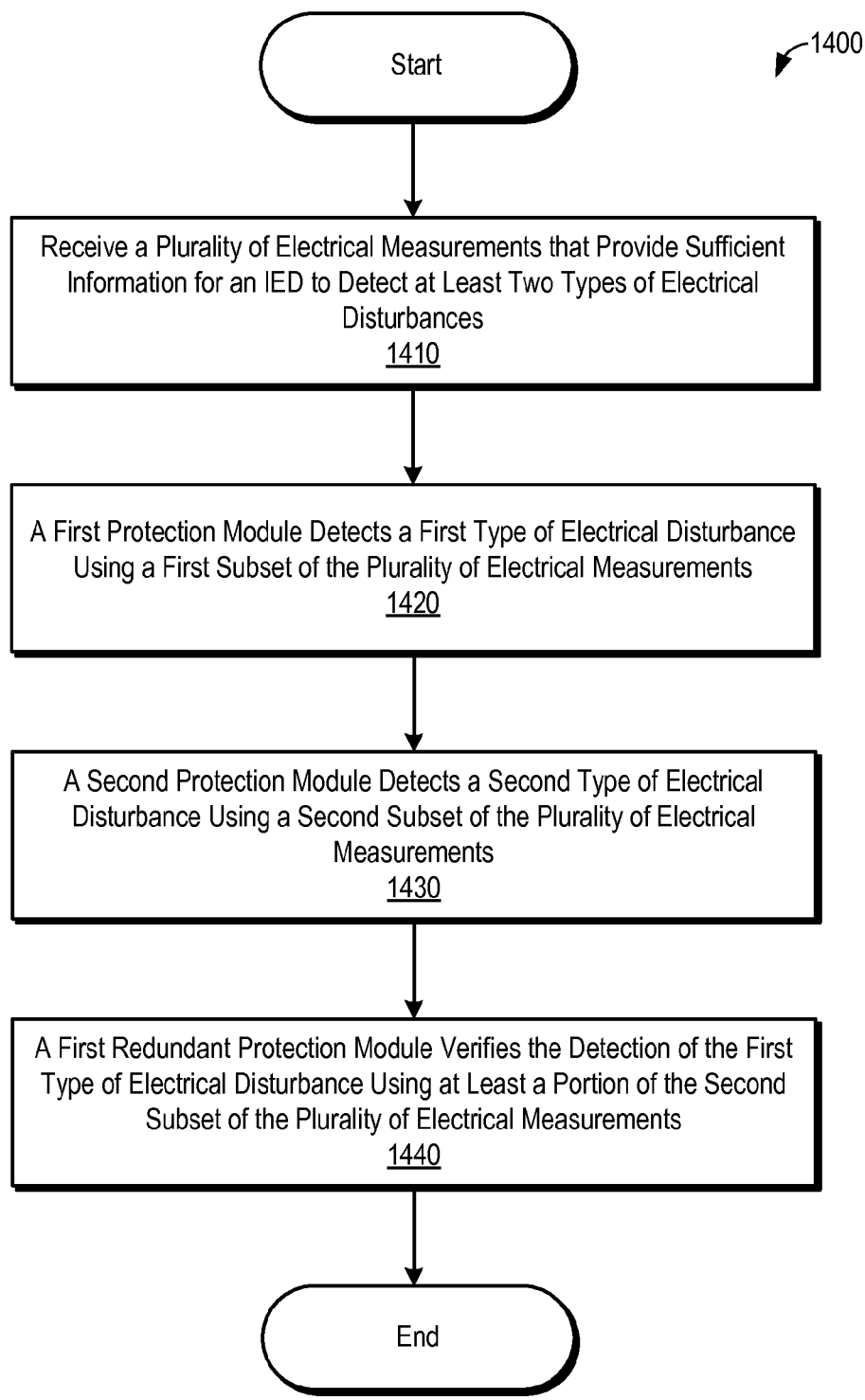
FIG. 14 illustrates a flow chart of an embodiment of a method for verifying the detection of an electrical disturbance by a first protection module using a redundant protection module configured to use redundantly available electrical measurements.

FIG. 14 illustrates a flow chart of an embodiment of a method 1400 for verifying the detection of an electrical disturbance by a first protection module using a redundant protection module configured to use redundantly available electrical measurements. As illustrated, an IED may receive a plurality of electrical measurements that provide sufficient information for an IED to detect at least two types of electrical disturbances, at 1410. The IED may include a first protection module that detects a first type of electrical disturbance using a first subset of the plurality of electrical measurements, at 1420.

The IED may also include a second protection module that detects a second type of electrical disturbance using a second subset of the plurality of electrical measurements, at 1430. Additionally, the IED may include a redundant protection module that verifies the detection of the first type of electrical disturbance using at least a portion of the second subset of the plurality of electrical measurements, at 1440. Accordingly, since microprocessor based IEDs may receive the same inputs that legacy single-function protective elements received, numerous redundant electrical measurement inputs may be available to the multi-function IED. By leveraging these redundant electrical measurement inputs, increased accuracy may be obtained through redundant verification of primary protection modules. Such redundant verification may reduce or eliminate IED misoperation.

Figure 15:
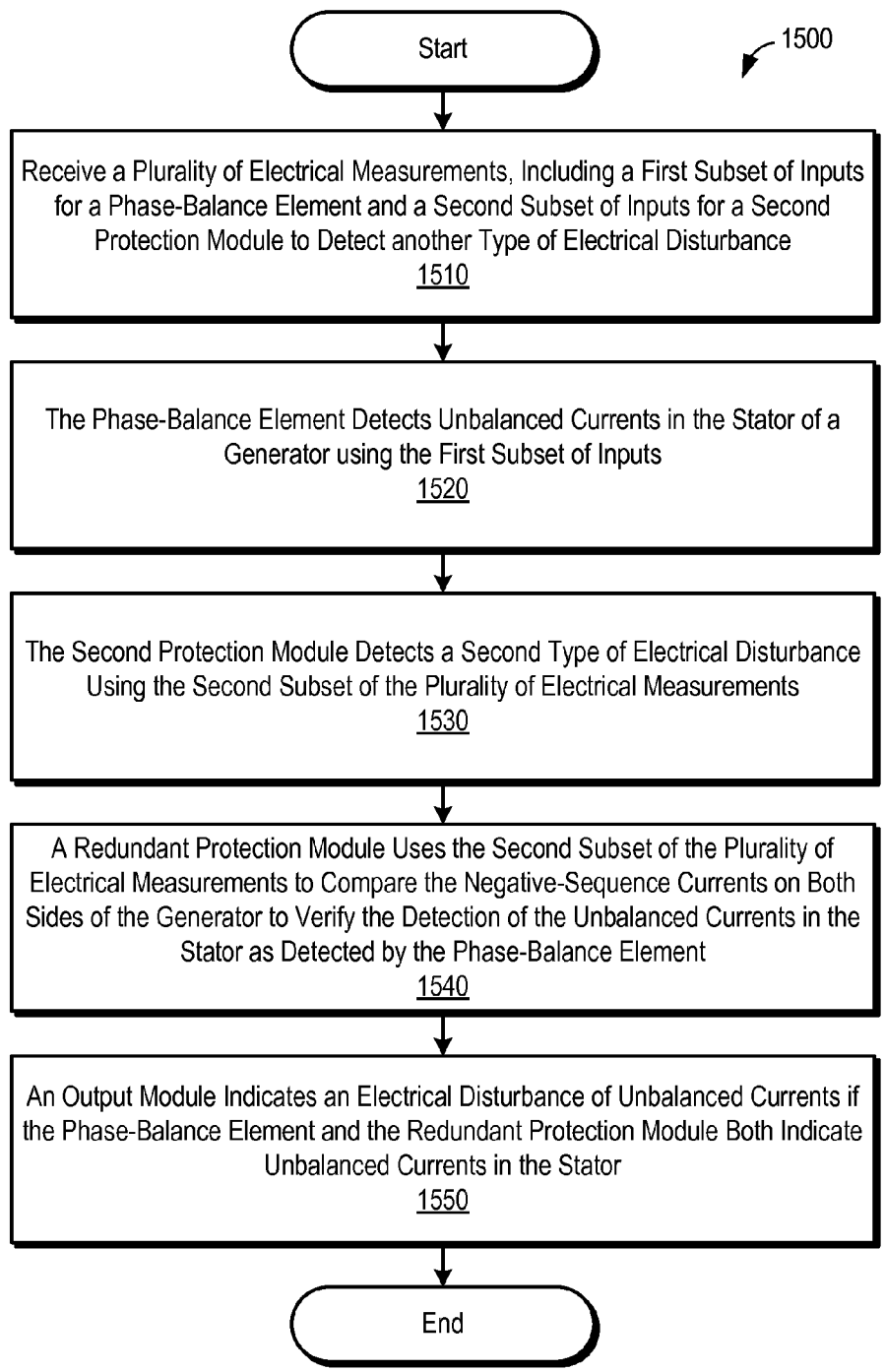
FIG. 15 illustrates a flow chart of a specific example of a method for verifying the detection of an electrical disturbance by a first protection module using redundantly available electrical measurements.

FIG. 15 illustrates a flow chart of a specific example of a method 1500 for verifying the detection of an electrical disturbance by a first protection module using redundantly available electrical measurements. An IED may receive a plurality of electrical measurements, including a first subset of inputs for a phase-balance element and a second subset of inputs for a second protection module configured to detect another type of electrical disturbance, at 1510. The phase-balance element may detect unbalanced currents in the stator of a generator using the first subset of inputs, at 1520. The second protection module may detect a second type of electrical disturbance using the second subset of the plurality of electrical measurements, at 1530. A redundant protection module, using at least some of the second subset of the plurality of electrical measurements, may compare the negative-sequence currents on both sides of the generator to verify the detection of the unbalanced currents in the stator as detected by the phase-balance element, at 1540. Finally, the output module may indicate that unbalanced currents exist when the phase-balance element and redundant protection module both indicate that an unbalanced current exists in the stator, at 1550.

The above description provides numerous specific details for a thorough understanding of the embodiments described herein. However, those of skill in the art will recognize that one or more of the specific details may be omitted, modified, and/or replaced by a similar process or system.

What is claimed:

1. An Intelligent electronic device (IED) for detecting an electrical disturbance in an electric power delivery system, comprising:
 an input module configured to obtain a plurality of measurements associated with an electric power delivery system, the plurality of measurements providing sufficient information for the IED to detect at least two types of electrical disturbances;
 protection logic configured to detect an electrical disturbance in the electric power delivery system, comprising:
  a first protection module configured to detect a first type of electrical disturbance using a first subset of the plurality of measurements;
  a second protection module configured to detect a second type of electrical disturbance using a second subset of the plurality of measurements; and
  a first redundant protection module configured to verify the detection of the first type of electrical disturbance using at least a portion of the second subset of the plurality of measurements; and
 an output module configured to selectively indicate an electrical disturbance exists based on the output of the protection logic.

2. The system of claim 1, further comprising a second redundant protection module configured to detect the second type of electrical disturbance using at least a portion of the first subset of the plurality of measurements.

3. The system of claim 1, wherein the output module is configured to indicate an electrical disturbance exists when at least one of the first protection module, the second protection module, and the first redundant protection module detect an electrical disturbance.

4. The system of claim 1, wherein the output module is configured to generate a trip output to cause a breaker to trip based on the output of the protection logic.

5. The system of claim 1, wherein at least one of the plurality of measurements comprises a current measurement.

6. The system of claim 1, wherein at least one of the plurality of measurements comprises a voltage measurement.

7. The system of claim 1, wherein at least one of the plurality of measurements comprises one of a temperature measurement and an arc-flash detection measurement.

8. The system of claim 1, wherein the plurality of measurements are associated with one of a generator, a transformer, a transmission line, and a distribution line in the electric power delivery system.

9. The system of claim 1, wherein the electric power delivery system comprises a three-phase electric power delivery system with three phase lines, and
wherein the plurality of measurements comprises at least one measurement for each of the three phase lines.

10. The system of claim 9, wherein the first protection module comprises a current differential element configured to determine when a current differential between a first phase line and a second phase line is greater than a predetermined threshold,
wherein the first redundant protection module is configured to determine when a current differential between a third phase line and one of the first and second phase lines is greater than the predetermine threshold, and
wherein the output module is configured to indicate an electrical disturbance exists when both the current differential element and the first redundant protection module detect a current differential greater than the predetermined threshold.

11. The system of claim 9, wherein the first protection module comprises a phase-balance current element, and
wherein the first redundant protection module is configured determine a difference between the negative-sequence current on the phase lines and the negative-sequence current on a neutral line, and
wherein the output module is configured to indicate an electrical disturbance exists when the phase-balance element detects an electrical disturbance and when the difference between the negative-sequence current on the phase lines and the negative-sequence current on the neutral line is greater than a predetermined threshold.

12. The system of claim 9, wherein the plurality of measurements are associated with a generator,
wherein the first protection module comprises a directional power element,
wherein the first redundant protection module is configured to determine a difference between the per-phase power between a first phase and a second phase, and the per-phase power between the second phase and a third phase, and
wherein the output module is configured to indicate an electrical disturbance exists when the directional power element detects an electrical disturbance, when the difference in the per-phase power between the first phase and the second phase is above a predetermine threshold, and when the difference in the per-phase power between the second phase and the third phase is above a predetermined threshold.

13. The system of claim 9, wherein the plurality of measurements are associated with a generator,
wherein the first protection module comprises a first Volts-per-Hertz element configured to monitor a first phase line,
wherein the first redundant protection module comprises a second Volts-per-Hertz element configured to monitor a second phase line, and
wherein the output module is configured to indicate an electrical disturbance exists when the first Volts-per-Hertz element detects an electrical disturbance and the second Volts-per-Hertz element detects an electrical disturbance.

14. The system of claim 9, wherein the first protection module comprises an over-voltage element configured to detect an overvoltage on a first phase line,
wherein the first redundant protection module comprises a second overvoltage element configured to detect an overvoltage on a second phase line, and
wherein the output module is configured to indicate an electrical disturbance exists when the first protection module detects an overvoltage on the first phase line and the first redundant protection module detects an overvoltage on the second phase line.

15. The system of claim 9, wherein the first protection module comprises an over-current element configured to detect an overcurrent on a first phase line,
wherein the first redundant protection module comprises a second overcurrent element configured to detect an overcurrent on a second phase line, and
wherein the output module is configured to indicate an electrical disturbance exists when the first protection module detects an overcurrent on the first phase line and the first redundant protection module detects an overcurrent on the second phase line.

16. The system of claim 9, wherein the plurality of measurements are associated with a generator,
wherein the first protection module comprises a loss of excitation element,
wherein the first redundant protection module comprises a negative sequence voltage detector and a negative-sequence current detector, and
wherein the protection logic is configured to indicate an electrical disturbance exists when the first protection module detects a loss of excitement, the negative-sequence voltage detector has a zero value, and the negative-sequence current detector has a zero value.

17. The system of claim 9, wherein the plurality of measurements are associated with a generator,
wherein the first protection module comprises a distance element,
wherein the first redundant protection module is configured determine a difference between the negative-sequence current on the phase lines and the negative-sequence current on a neutral line, and
wherein the output module is configured to indicate an electrical disturbance exists when the distance element detects an electrical disturbance and when the difference between the negative-sequence current on the phase lines and the negative-sequence current on the neutral line is greater than a predetermined threshold.

18. The system of claim 9, wherein the first protection module comprises an overcurrent element,
wherein the first redundant protection module is configured to determine an increase in a differential current and determine a decrease in a restraint current, such that the first redundant protection module detects an open current transformer when the increase in the differential current and the decrease in a restraint current are approximately equivalent, and the determined values for the differential current and the restraint current are above a predetermined threshold, and wherein the output module is configured to indicate an electrical disturbance exists when the overcurrent element detects an electrical disturbance and when the first redundant protection module does not detect an open current transformer.

19. A method for detecting an electrical disturbance in an electric power delivery system, comprising:

in a first intelligent electronic device (IED), receiving a plurality of measurements associated with an electric power delivery system, the plurality of measurements providing sufficient information for the IED to detect at least two types of electrical disturbances;

a first protection module detecting a first type of electrical disturbance using a first subset of the plurality of measurements;

a second protection module detecting a second type of electrical disturbance using a second subset of the plurality of measurements;

a first redundant protection module verifying the detection of the first type of electrical disturbance using at least a portion of the second subset of the plurality of measurements; and indicating an electrical disturbance exists based on the detection of the first type of electrical disturbance and the verification of the detection of the first type of electrical disturbance.

20. The method of claim 19, further comprising a second redundant protection module verifying the detection of the second type of electrical disturbance using at least a portion of the first subset of the plurality of measurements.

21. The method of claim 19, wherein indicating an electrical disturbance exists is performed when at least one of the first protection module, the second protection module, and the first redundant protection module detect an electrical disturbance.

22. The method of claim 19, further comprising generating a trip output to cause a breaker to trip based on the output of at least one of the first protection module, the second protection module, and the first redundant protection module.

23. The method of claim 19, wherein at least one of the plurality of measurements comprises a current measurement.

24. The method of claim 19, wherein at least one of the plurality of measurements comprises a voltage measurement.

25. The method of claim 19, wherein at least one of the plurality of measurements comprises one of a temperature measurement and an arc-flash detection measurement.

26. The method of claim 19, wherein the plurality of measurements are associated with one of a generator, a transformer, a transmission line, and a distribution line in the electric power delivery system.

27. The method of claim 19, wherein the electric power delivery system comprises a three-phase electric power delivery system with three phase lines, and wherein the plurality of measurements comprises at least one measurement for each of the three phase lines.

28. The method of claim 27, wherein detecting a first type of electrical disturbance comprises determining when a current differential of a first phase line and a second phase line is greater than a predetermined threshold, wherein verifying the detection of the first type of electrical disturbance comprises determining when a current differential between a third phase line and one of the first and second phase lines is greater than the predetermine threshold, and wherein indicating an electrical disturbance exists comprises indicating an electrical disturbance when both the first protection module and the first redundant protection module detect an electrical disturbance.

29. The method of claim 27, wherein the first protection module comprises a phase-balance current element, and wherein verifying the detection of the first type of electrical disturbance comprises determining a difference between the negative-sequence current on the phase lines and the negative-sequence current on a neutral line, and wherein indicating an electrical disturbance exists comprises indicating an electrical disturbance when both the first protection module and the first redundant protection module detect an electrical disturbance.

30. The method of claim 27, wherein the plurality of measurements are associated with a generator, wherein the first protection module comprises a directional power element, wherein verifying the detection of the first type of electrical disturbance comprises determining a difference between the per-phase power between a first phase and a second phase, and the per-phase power between the second phase and a third phase, and wherein indicating an electrical disturbance exists comprises indicating an electrical disturbance when both the first protection module and the first redundant protection module detect an electrical disturbance.

31. The method of claim 27, wherein the plurality of measurements are associated with a generator, wherein the first protection module comprises a first Volts-per-hertz element configured to monitor a first phase line, wherein the first redundant protection module comprises a second volts-per-Hertz element configured to monitor a second phase line, and wherein indicating an electrical disturbance exists comprises indicating an electrical disturbance when both the first Volts-per-Hertz element detects an electrical disturbance and the second Volts-per-Hertz element detects an electrical disturbance.

32. The method of claim 27, wherein the first protection module comprises an over-voltage element and wherein detecting the first type of electrical disturbance comprises detecting an overvoltage on a first phase line, wherein the first redundant protection module comprises a second overvoltage element and wherein verifying the detection of the first type of electrical disturbance comprises detecting an overvoltage on a second phase line, and wherein indicating an electrical disturbance exists comprises indicating an electrical disturbance when the first protection module detects an overvoltage on the first phase line and the first redundant protection module detects an overvoltage on the second phase line.

33. The method of claim 27, wherein the first protection module comprises an over-current element and wherein detecting the first type of electrical disturbance comprises detecting an overcurrent on a first phase line, wherein the first redundant protection module comprises a second overcurrent element and wherein verifying the detection of the first type of electrical disturbance comprises detecting an overcurrent on a second phase line, and wherein indicating an electrical disturbance exists comprises indicating an electrical disturbance when the first protection module detects an overcurrent on the first phase line and the first redundant protection module detects an overcurrent on the second phase line.

34. The method of claim 27, wherein the plurality of measurements are associated with a generator,
wherein the first protection module comprises a loss of excitation element,
wherein the first redundant protection module comprises a negative-sequence voltage detector and a negative-sequence current detector, and
wherein indicating an electrical disturbance exists comprises indicating an electrical disturbance when the first protection module detects a loss of excitement, the negative-sequence voltage detector has a zero value, and the negative-sequence current detector has a zero value.

35. The method of claim 27, wherein the plurality of measurements are associated with a generator,
wherein the first protection module comprises a distance element,
wherein verifying the detection of the first type of electrical disturbance comprises determining a difference between the negative-sequence current on the phase lines and the negative-sequence current on a neutral line, and
wherein indicating an electrical disturbance exists comprises indicating an electrical disturbance when the distance element detects an electrical disturbance and when the difference between the negative-sequence current on the phase lines and the negative-sequence current on the neutral line is greater than a predetermined threshold.

36. The method of claim 27, wherein the first protection module comprises an overcurrent element,
wherein verifying the detection of the first type of electrical disturbance comprises the first redundant protection module detecting an open current transformer when the increase in the differential current and the decrease in a restraint current are approximately equivalent and determined values for the differential current and the restraint current are above a predetermined threshold, and
wherein indicating an electrical disturbance exists comprises indicating an electrical disturbance when the overcurrent element detects an electrical disturbance and when the first redundant protection module does not detect an open current transformer.

* * * * *